United States Patent
Rau et al.

(10) Patent No.: US 7,400,379 B2
(45) Date of Patent: Jul. 15, 2008

(54) APPARATUS FOR MEASURING AN EXPOSURE INTENSITY ON A WAFER

(75) Inventors: Jenspeter Rau, Munich (DE); Silvio Teuber, Dresden (DE)

(73) Assignee: Infineon Technologies AG, Munich (DE)

( * ) Notice: Subject to any disclaimer, the term of this patent is extended or adjusted under 35 U.S.C. 154(b) by 730 days.

(21) Appl. No.: 10/899,318

(22) Filed: Jul. 26, 2004

(65) Prior Publication Data

US 2005/0037268 A1    Feb. 17, 2005

(30) Foreign Application Priority Data

Aug. 12, 2003    (DE) ................. 103 37 037

(51) Int. Cl.
*G03B 27/42* (2006.01)
*G03B 27/54* (2006.01)

(52) U.S. Cl. ............... 355/53; 355/67; 355/71

(58) Field of Classification Search ........... 355/53, 355/67, 71; 378/34, 35; 250/492.2
See application file for complete search history.

(56) References Cited

U.S. PATENT DOCUMENTS

| | | | |
|---|---|---|---|
| 6,078,393 A | 6/2000 | Oohashi et al. | |
| 6,268,093 B1 | 7/2001 | Kenan et al. | |
| 6,552,776 B1 | 4/2003 | Wristers et al. | |
| 2001/0018153 A1 | 8/2001 | Irie | |
| 2002/0001759 A1 | 1/2002 | Ohashi et al. | |
| 2002/0186879 A1 | 12/2002 | Hemar et al. | |

FOREIGN PATENT DOCUMENTS

| | | |
|---|---|---|
| EP | 1081489 A2 | 3/2001 |
| JP | 57045231 | 3/1982 |
| JP | 10078668 | 3/1998 |
| US | 0628806 A2 | 4/1994 |

OTHER PUBLICATIONS

Dutch Search Report dated Sep. 5, 2005.

*Primary Examiner*—Della J. Rutledge
(74) *Attorney, Agent, or Firm*—Fay Kaplun & Marcin; LLP

(57) ABSTRACT

An apparatus for measuring an exposure intensity on a wafer is disclosed. According to one aspect, an apparatus for measuring an exposure intensity on a wafer includes an exposure device for generating a radiation having a predetermined wavelength. Further, the apparatus includes a mask at a first predetermined distance from the exposure device for patterned exposure of a wafer A detection device detects the exposure intensity at a second predetermined distance from the exposure device. A compensation device can be moved into the beam path between the exposure device and the detection device for the purpose of influencing the beam path.

11 Claims, 2 Drawing Sheets

APPARATUS FOR MEASURING AN EXPOSURE INTENSITY ON A WAFER

TECHNICAL FIELD

The present invention relates to an apparatus for measuring an exposure intensity on a wafer, and in particular to an AIMS (aerial imaging microscope system), in which an aerial image of the exposure intensity of a mask on a wafer is detected. A device for detecting the aerial image of the exposure intensity e.g. on a silicon wafer, of a mask with or without a hard pellicle, is used for mask evaluation. Such a device is used for making a decision as to whether or not identified defects on a checked mask produce defects on a silicon wafer to be exposed. By means of an AIMS device, the intention is to measure and thus simulate the exposure conditions such as the corresponding image during the exposure of a wafer with a corresponding mask. Hard pellicles which are used on a mask have to be included as an influencing optical element in the beam path on account of their large thickness of approximately 0.8 mm.

BACKGROUND ART

Present-day systems use masks with a soft pellicle, a soft pellicle not influencing the beam path. An AIMS device in which masks with a soft pellicle are examined with regard to their quality need not permit the pellicle to be incorporated into the considerations. If an exposure source with 157 nm technology is used, a hard pellicle is necessary in order to withstand the radiation loading with the transmission properties remaining the same. However, a hard pellicle, as an additional glass plate in the beam path leads to imaging errors or aberrations of the lens.

Hitherto, an AIMS device has been provided with two different imaging lenses having imaging properties optimized for the respective mask, i.e. with or without a hard pellicle. Rapid checking of the optical imaging properties of a mask, i.e. the corresponding aerial image of the mask, without a pellicle under real conditions in a stepper, i.e. as if a hard pellicle were present, is not possible with a known AIMS device. In this case, it would be necessary firstly to mount a pellicle onto the mask, which pellicle, in the event of a defect occurring in the mask, would have to be demounted for a corresponding repair of the mask and be mounted again for subsequent checking of the repaired mask. This means an additional expenditure of time. It is nevertheless necessary to be able to examine the masks both with and without a hard pellicle.

SUMMARY OF THE INVENTION

Therefore, it is an object of the present invention to provide an apparatus for measuring an exposure intensity on a wafer which can be used to test masks with and without a hard pellicle mounted thereon, the masks without a mounted hard pellicle being inspected under the same exposure conditions as in a stepper, i.e. with a hard pellicle.

According to the invention, this object is achieved by means of the apparatus for measuring an exposure intensity on a wafer as specified in Claim 1 and by means of the method according to Claim 12.

The idea on which the present invention is based essentially consists in providing in an AIMS device, i.e. an apparatus for measuring an exposure intensity on a wafer, a compensation device that is made of a corresponding material, such as a hard pellicle, and can be pivoted in, which compensation device simulates a hard pellicle.

It is advantageously possible in this way to measure masks without a hard pellicle as if they were virtually provided with a hard pellicle. Repair locations on a mask can thus be verified under conditions as with a hard pellicle on the mask, even though no hard pellicle is used on the mask. Repeated verifications are thus possible in a short time. This results in a significant time saving, since an optical imaging with a pellicle becomes possible without a long delay. What is more, it is possible to significantly reduce the number of required hard pellicles especially in the development phase of a mask, which results in a reduction of costs since the hard pellicles for 157 nm technology are very costly.

Consequently, according to the present invention, in an AIMS device, a dummy plate composed of a hard pellicle material can be pivoted in between a mask and a detection device, and in particular between a mask and an imaging optical arrangement, so that measurements on masks which still do not carry a pellicle can be measured in such a way as if they are provided with a pellicle.

In the present invention, the problem mentioned in the introduction is solved in particular by the provision of an apparatus for measuring an exposure intensity on a wafer having: an exposure device for generating a radiation having a predetermined wavelength; a mask at a first predetermined distance from the exposure device for patterned exposure of a wafer; a detection device for detecting the exposure intensity at a second predetermined distance from the exposure device; and a compensation device which can be moved into the beam path between the exposure device and the detection device for the purpose of influencing the beam path (13).

Advantageous developments and refinements of the apparatus according to the invention for measuring an exposure intensity on a wafer are found in the subclaims.

In accordance with one preferred development, the compensation device has a material, preferably fluorine-doped quartz glass, from which hard pellicles are formed.

In accordance with a further preferred development, the compensation device has a thickness of less than 1 mm, preferably 0.8 mm.

In accordance with a further preferred development, the radiation of the exposure device has a wavelength of less than 200 nm, preferably less than 160 nm.

In accordance with a further preferred development, the compensation device is fixed in a mount that can be precisely determined in terms of its position, i.e. in terms of the distance in the exposure direction, and/or in terms of the angle with respect to the exposure direction and/or with respect to the mask, and can be set independently of the mask.

In accordance with a further preferred development, the mount of the compensation device has a device for generating predetermined mechanical stresses in the compensation device.

In accordance with a further preferred development, the compensation device is arranged between the detection device and the mask.

In accordance with a further preferred development, the exposure device has a light source, preferably a laser.

In accordance with a further preferred development, the movable compensation device is arranged permanently in the beam path.

In accordance with a further preferred development, provision is made of an imaging optical arrangement having at least one lens for generating a predetermined beam path between the mask and the detection device, the imaging optical arrangement being optimized for a mask with a hard pellicle.

In accordance with a further preferred development, a CCD camera is provided as the detection device.

An exemplary embodiment of the invention is illustrated in the drawings and explained in more detail in the description below.

In the figures:

BRIEF DESCRIPTION OF THE DRAWINGS

FIG. 1 shows a diagrammatic side view of an AIMS device for elucidating an embodiment of the present invention with a compensation device pivoted in; and FIG. 2 shows a diagrammatic side view of an AIMS device for elucidating an embodiment of the present invention with a compensation device not pivoted in.

DETAILED DESCRIPTION OF THE INVENTION

In the figures, identical reference symbols designate identical or functionally identical component parts.

Figure 1:
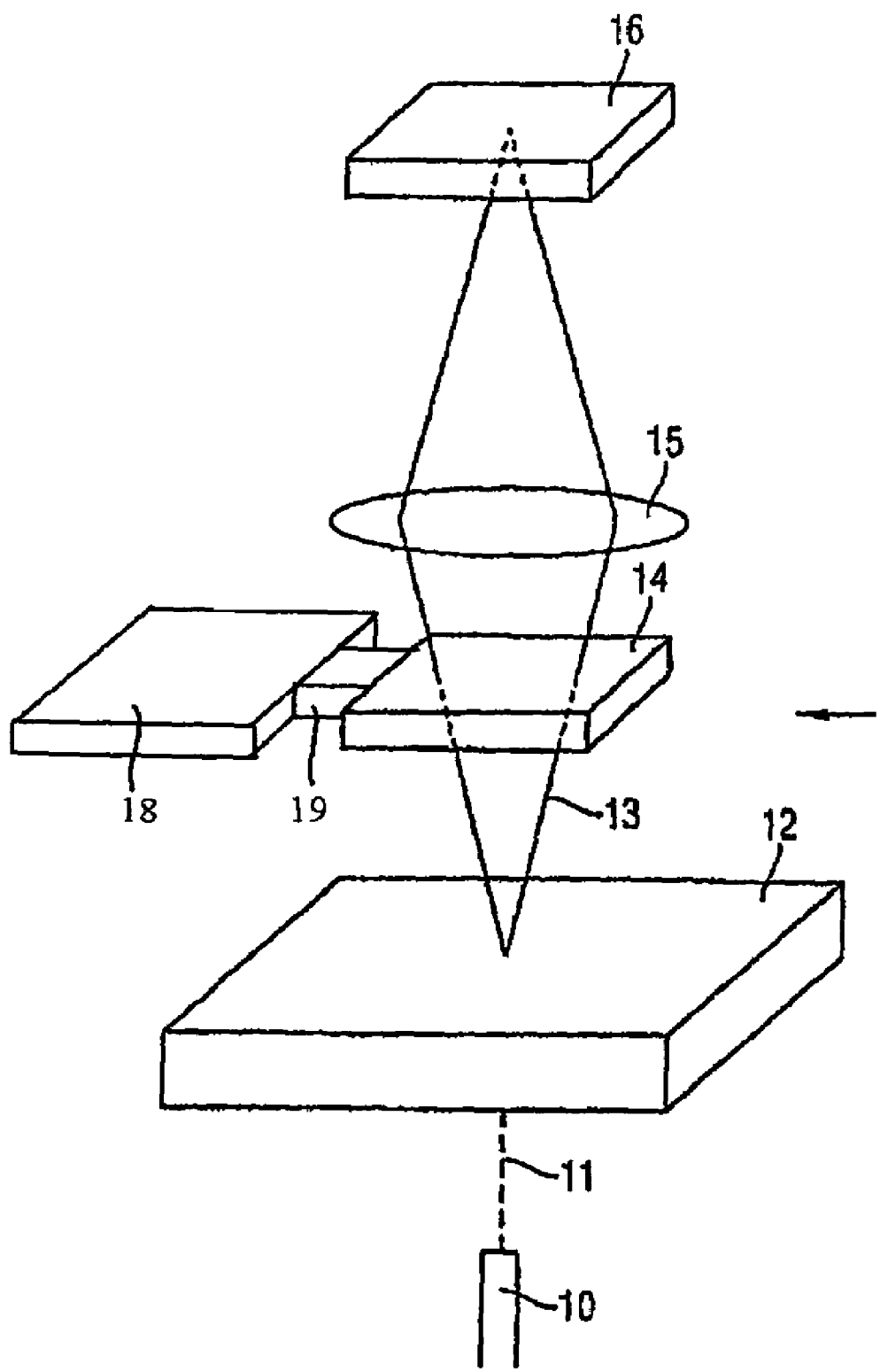

FIG. 1 illustrates a diagrammatic side view of an apparatus according to the invention for measuring an exposure intensity on a wafer in accordance with an embodiment of the present invention. An exposure device 10, preferably a laser, emits a radiation 11 having a predetermined wavelength, preferably of less than 160 nm, perpendicular to the surface of a mask 12. the mask 12 serves, in a semiconductor fabrication process, for patterned exposure of a wafer surface (not illustrated in FIG. 1). The mask 12 in accordance with FIG. 1 is provided without a mounted hard pellicle.

A compensation device 14 is provided in the beam path 13 of the, preferably monochromatic, radiation 11 of the exposure device 10. The compensation device 14, which can be pivoted in in the horizontal direction, preferably comprises a material that corresponds to a hard pellicle, e.g. fluorine-doped quartz glass. The thickness of the compensation device 14 is less than 1 mm and in particular 0.8 mm. The compensation device 14 is held in a mount 18 that can be used to determine and set, in a predetermined manner, the distance between the compensation device 14 and the mask and furthermore the angular position with respect to the exposure device 10, essentially perpendicular to the mask 12. The influence of a hard pellicle on the beam path 13 is simulated or modelled with the aid of the compensation device 14, which is pivoted into the beam path 13 in accordance with FIG. 1.

By means of a downstream imaging optical arrangement 15 having at least one lens, which is optimized for masks with a hard pellicle, the beam path 13 is focussed and detected by a detection device 16 at a predetermined distance from the mask 12. The detection device 16 is preferably a CCD camera (charged coupled device). In order to check the mask 12, the latter is moved with a predetermined scanning that is as fine as possible relative to the exposure device 10, the compensation device 14, the imaging optical arrangement 15, and the detection device 16. The mount 18 of the compensation device 14 is additionally provided with a device 19 for generating a predetermined mechanical stress in the compensation device 14 for the purpose of modifying the beam path 13.

Figure 2:
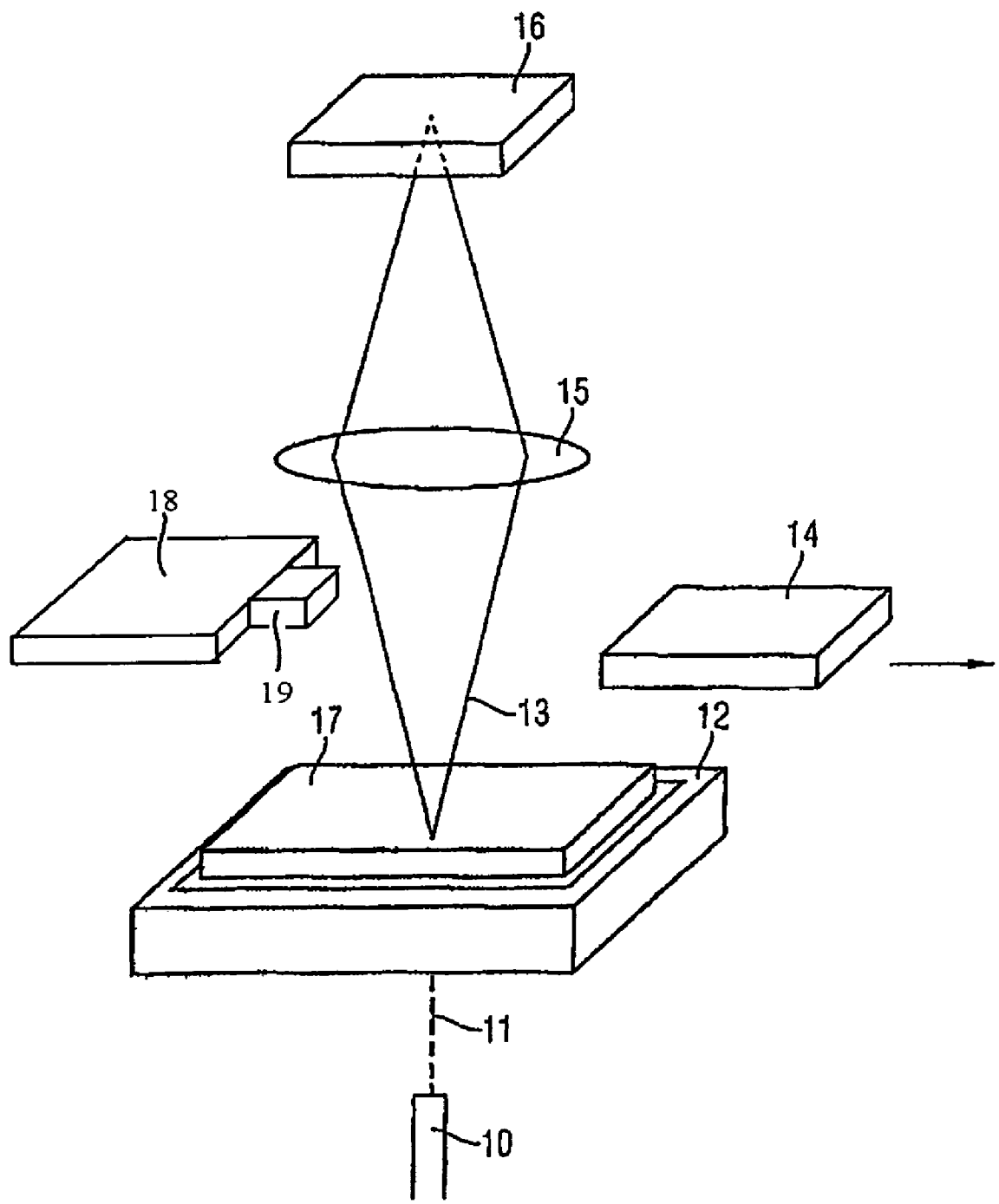

In the embodiment in accordance with FIG. 2, in contrast to the embodiment in accordance with FIG. 1, the illustration shows a mask 12 with a hard pellicle 17 mounted thereon. If such a mask 12 with a hard pellicle 17 is tested or inspected, then the compensation device 14 is pivoted out of the beam path 13, so that no radiation 11 of the exposure device 10 passes the mask, the pellicle and the compensation device 14 before possible defect locations of the mask are identified via the imaging optical arrangement 15 in the detection device 16.

By virtue of this movable compensation device 14, preferably a glass plate, it is possible, using the same imaging optical arrangement 15, for both masks 12 with a hard pellicle 17 in accordance with FIG. 2 and masks 12 without a hard pellicle in accordance with FIG. 1 to be examined for faults rapidly and efficiently.

Although the present invention has been described above on the basis of a preferred exemplary embodiment, it is not restricted thereto, but rather can be modified in diverse ways. Thus, also conceivable is an apparatus for measuring an exposure intensity on a wafer or an AIMS apparatus which has two lenses integrated in a turret as the imaging optical arrangement 15 and either one lens or the other is pivoted into the beam path 13. A further turret that can be moved independently of the first-mentioned turret preferably has in each case an opening with and an opening without a compensation device or glass plate (modified quartz glass, optimized for light having the wavelength of 157 nm) which is situated in the beam path 13 between imaging optical arrangement 15 and mask 12.

Moreover, the mount 18 in which the compensation device 14 is situated can be set independently of the mask 12 in the vertical direction, i.e. in the direction of the z-axis according to DIN 70000, and with regard to the angles with respect to the mask 12 and with respect to the exposure direction 10 of the radiation 11. Furthermore, the compensation device 14 is preferably tensed into a frame in such a way that predetermined mechanical stress states of the compensation device 14 can be adjusted by means of targeted manipulation.

What is claimed is:

1. Apparatus for measuring an exposure intensity on a wafer having:
    (a) an exposure device for generating a radiation having a predetermined wavelength;
    (b) a mask at a first predetermined distance from the exposure device for patterned exposure of a wafer;
    (c) a detection device for detecting the exposure intensity at a second predetermined distance from the exposure device; and
    (d) a compensation device which can be moved into the beam path between the exposure device and the detection device for the purpose of influencing the beam path, wherein the compensation device is made of fluorine-doped quartz glass from which hard pellicles are formed.

2. Apparatus according to claim 1 wherein the compensation device has a thickness of less than 1 mm, preferably 0.8 mm.

3. Apparatus according to claim 1, wherein the radiation of the exposure device has a wavelength of less than 200 nm, preferably less than 160 nm.

4. Apparatus according to claim 1, wherein the movable compensation device is fixed in a movable mount that can be precisely determined in terms of the distance in the exposure direction, and/or in terms of the angle with respect to the exposure direction and/or with respect to the mask, and can be set independently of the mask.

5. Apparatus according to claim 4, wherein the mount of the movable compensation device has a device for generating predetermined mechanical stresses in the movable compensation device.

6. Apparatus according to claim 1, wherein the movable compensation device is arranged between the detection device and the mask.

7. Apparatus according to claim 1, wherein the exposure device has a light source, preferably a laser.

8. Apparatus according to claim 1, wherein the movable compensation device is arranged permanently in the beam path.

9. Apparatus according to claim 1, wherein provision is made of an imaging optical arrangement having at least one lens for generating a predetermined beam path between the mask and the detection device, the imaging optical arrangement being optimized for a mask with a hard pellicle.

10. Apparatus according to claim 1, wherein the detection device has a CCD camera.

11. Method for measuring an exposure intensity on a wafer, having the following steps:

(a) generating a radiation having a predetermined wavelength by means of an exposure device.

(b) patterned exposing a detection device instead of a wafer by means of a mask at a first predetermined distance from the exposure device.

(c) detecting the exposure intensity by means of the detection device at a second predetermined distance from the exposure device; and (d) influencing of the beam path by means of a compensation device that can be moved into the beam path between the exposure device and the detection device if a mask without a hard pellicle is measured, wherein the compensation device is made of fluorine-doped quartz glass from which hard pellicles are formed.

* * * * *